United States Patent
Dolainsky et al.

(10) Patent No.: US 7,434,197 B1
(45) Date of Patent: Oct. 7, 2008

(54) METHOD FOR IMPROVING MASK LAYOUT AND FABRICATION

(75) Inventors: Christoph Dolainsky, Wessling (DE);
Jonathan O. Burrows, San Jose, CA (US); Dennis Ciplickas, San Jose, CA (US); Joseph C. Davis, San Jose, CA (US); Rakesh Vallishayee, San Jose, CA (US); Howard Read, San Jose, CA (US); Larg. H. Weiland, Livermore, CA (US); Christopher Hess, San Carlos, CA (US)

(73) Assignee: PDF Solutions, Inc., San Jose, CA (US)

( * ) Notice: Subject to any disclaimer, the term of this patent is extended or adjusted under 35 U.S.C. 154(b) by 114 days.

(21) Appl. No.: 11/262,148

(22) Filed: Oct. 28, 2005

Related U.S. Application Data

(63) Continuation-in-part of application No. PCT/US2005/005456, filed on Feb. 22, 2005.

(60) Provisional application No. 60/548,488, filed on Feb. 26, 2004.

(51) Int. Cl.
*G06F 17/50* (2006.01)

(52) U.S. Cl. .......................................... 716/19; 716/21

(58) Field of Classification Search ............. 716/19–21; 430/5, 22
See application file for complete search history.

(56) References Cited

U.S. PATENT DOCUMENTS

| | | | | |
|---|---|---|---|---|
| 6,782,525 | B2 * | 8/2004 | Garza et al. | 716/19 |
| 6,954,911 | B2 * | 10/2005 | Pierrat | 716/4 |
| 6,968,527 | B2 * | 11/2005 | Pierrat | 716/19 |
| 2004/0019870 | A1 * | 1/2004 | Ohmori | 716/19 |

* cited by examiner

*Primary Examiner*—Jack Chiang
*Assistant Examiner*—Binh C Tat

(57) ABSTRACT

A hot spot is identified within a mask layout design. The hot spot represents a local region of the mask layout design having one or more feature geometries susceptible to producing one or more fabrication deficiencies. A test structure is generated for the identified hot spot. The test structure is defined to emulate the one or more feature geometries susceptible to producing the one or more fabrication deficiencies. The test structure is fabricated on a test wafer using specified fabrication processes. The as-fabricated test structure is examined to identify one or more adjustments to either the feature geometries of the hot spot of the mask layout design or the specified fabrication processes, wherein the identified adjustments are capable of reducing the fabrication deficiencies.

21 Claims, 10 Drawing Sheets

| DOE | | | | A | A1 | A2 | A3 | A4 | A5 | A6 | A7 | A8 |
|---|---|---|---|---|---|---|---|---|---|---|---|---|
| E | D | C | B | | | | | | | | | |
| E1 | D1 | C1 | B1 | | yes | yes | yes | yes | yes | yes | yes | yes |
| | | | B2 | | yes | yes | yes | yes | yes | yes | yes | yes |
| | | | B3 | | yes | yes | yes | yes | yes | yes | yes | yes |
| | | | B4 | | yes | yes | yes | yes | yes | yes | yes | yes |
| | | | B5 | | yes | yes | yes | yes | yes | yes | yes | yes |
| | | C2 | B1 | | yes | yes | yes | yes | yes | yes | yes | yes |
| | | | B2 | | yes | yes | yes | yes | yes | yes | yes | yes |
| | | | B3 | | yes | yes | yes | yes | yes | yes | yes | yes |
| | | | B4 | | yes | yes | yes | yes | yes | yes | yes | yes |
| | | | B5 | | yes | yes | yes | yes | yes | yes | yes | yes |
| | | C3 | B2 | | yes | yes | yes | yes | yes | yes | yes | yes |
| | | | B3 | | yes | yes | yes | yes | yes | yes | yes | yes |
| | | | B4 | | yes | yes | yes | yes | yes | yes | yes | yes |
| | | C4 | B2 | | yes | yes | yes | yes | yes | yes | yes | yes |
| | | | B3 | | yes | yes | yes | yes | yes | yes | yes | yes |
| | | | B4 | | yes | yes | yes | yes | yes | yes | yes | yes |
| | D2 | C1 | B3 | | yes | yes | yes | yes | yes | yes | yes | yes |
| | | C2 | B3 | | yes | yes | yes | yes | yes | yes | yes | yes |
| | | C3 | B3 | | yes | yes | yes | yes | yes | yes | yes | yes |
| | | C4 | B3 | | yes | yes | yes | yes | yes | yes | yes | yes |
| E2 | D1 | C1 | B1 | | yes | yes | yes | yes | yes | yes | yes | yes |
| | | | B2 | | yes | yes | yes | yes | yes | yes | yes | yes |
| | | | B3 | | yes | yes | yes | yes | yes | yes | yes | yes |
| | | | B4 | | yes | yes | yes | yes | yes | yes | yes | yes |
| | | | B5 | | yes | yes | yes | yes | yes | yes | yes | yes |
| | | C2 | B1 | | yes | yes | yes | yes | yes | yes | yes | yes |
| | | | B2 | | yes | yes | yes | yes | yes | yes | yes | yes |
| | | | B3 | | yes | yes | yes | yes | yes | yes | yes | yes |
| | | | B4 | | yes | yes | yes | yes | yes | yes | yes | yes |
| | | | B5 | | yes | yes | yes | yes | yes | yes | yes | yes |
| | | C3 | B2 | | yes | yes | yes | yes | yes | yes | yes | yes |
| | | | B3 | | yes | yes | yes | yes | yes | yes | yes | yes |
| | | | B4 | | yes | yes | yes | yes | yes | yes | yes | yes |
| | | C4 | B2 | | yes | yes | yes | yes | yes | yes | yes | yes |
| | | | B3 | | yes | yes | yes | yes | yes | yes | yes | yes |
| | | | B4 | | yes | yes | yes | yes | yes | yes | yes | yes |
| | D2 | C1 | B3 | | yes | yes | yes | yes | yes | yes | yes | yes |
| | | C2 | B3 | | yes | yes | yes | yes | yes | yes | yes | yes |
| | | C3 | B3 | | yes | yes | yes | yes | yes | yes | yes | yes |
| | | C4 | B3 | | yes | yes | yes | yes | yes | yes | yes | yes |

FIGURE 5

METHOD FOR IMPROVING MASK LAYOUT AND FABRICATION

CROSS-REFERENCE TO RELATED APPLICATIONS

This application is a continuation-in-part of prior PCT Application No. PCT/US2005/005456, filed Feb. 22, 2005, which claims the benefit of U.S. Provisional Application No. 60/548,488, filed Feb. 26, 2004. The disclosure of each above-identified application is incorporated herein by reference.

BACKGROUND

As integrated circuit feature sizes continue to decrease, challenges associated with fabricating the smaller feature sizes continue to increase. For example, difficulty in delineating smaller mask layout features using standard photolithography techniques is becoming a significant contributor to both yield loss and yield variability. To compensate for inadequacies in photolithography capability at the sub-micron level, efforts have been increased in the area of electronic design automation (EDA), such as reticle enhancement technology (RET) and optical proximity correction (OPC). However, complexities of the physical design topography and its complex interaction with the photolithography process make calibration of the RET/OPC software difficult. In addition to calibration difficulty, RET/OPC software is not currently sophisticated enough to make large scale changes to the physical design as is often necessary to resolve certain complex interactions. Thus, use of present EDA technologies often leads to incomplete corrections of the physical design with corresponding systemic yield loss and yield variability problems. Therefore, a method is needed to improve mask layout and fabrication.

SUMMARY

In one embodiment, a method is disclosed for examining aspects of a mask layout design. The method includes identifying a hot spot in a mask layout design. The hot spot represents a local region of the mask layout design having one or more feature geometries that are susceptible to producing one or more fabrication deficiencies. The method also includes generating a test structure for the identified hot spot. The test structure is defined to emulate the feature geometries that are susceptible to producing the fabrication deficiencies. The method further includes fabricating the test structure on a test wafer using specified fabrication processes, and examining the test structure as fabricated on the test wafer. The examining of the as-fabricated test structure is performed to identify one or more adjustments to either the feature geometries of the hot spot of the mask layout design or the specified fabrication processes, wherein the one or more adjustments are capable of reducing the fabrication deficiencies.

In another embodiment, another method is disclosed for examining aspects of a mask layout design. The method includes identifying a hot spot in a mask layout design, wherein the hot spot represents a local region of the mask layout design having one or more feature geometries that are susceptible to producing one or more fabrication deficiencies. The method also includes identifying a test structure that is defined to emulate the one or more feature geometries that are susceptible to producing the one or more fabrication deficiencies. The method further includes examining measurement data corresponding to the test structure having been fabricated on a test wafer using specified fabrication processes. The examining enables identification of one or more adjustments to reduce the fabrication deficiencies, wherein the one or more adjustments correspond to a feature geometry adjustment within the hot spot of the mask layout design and/or a fabrication process adjustment.

In another embodiment, a method is disclosed for improving a semiconductor fabrication process flow. The method includes identifying a test structure that is defined to emulate one or more feature geometries that can be present within a mask layout. The method also includes acquiring fabrication process parameters to be used in fabricating a portion of circuitry represented by the test structure. Then, the identified test structure is fabricated on a test wafer using the fabrication process parameters. The method further includes examining the test structure fabricated on the test wafer to determine whether an adjustment to the fabrication process parameters is required to acceptably fabricate the test structure.

In another embodiment, a computer readable medium including program instructions for examining aspects of a mask layout design is disclosed. The computer readable medium includes program instructions for identifying a hot spot in a mask layout design. The hot spot represents a local region of the mask layout design having one or more feature geometries susceptible to producing one or more fabrication deficiencies. The computer readable medium also includes program instructions for identifying a test structure that is defined to emulate the feature geometries susceptible to producing the fabrication deficiencies. Program instructions are also included for examining measurement data corresponding to the test structure having been fabricated on a test wafer using specified fabrication processes. Examination of the measurement data enables identification of one or more adjustments to reduce the fabrication deficiencies, wherein the identified adjustments correspond to a feature geometry adjustment within the hot spot of the mask layout design and/or a fabrication process adjustment.

In another embodiment, a computer readable medium including program instructions for improving a semiconductor fabrication process flow is disclosed. The computer readable medium includes program instructions for identifying a test structure. The test structure is defined to emulate one or more feature geometries that can be present within a mask layout. The computer readable medium also includes program instructions for examining measurement data of the test structure having been fabricated on a test wafer using a particular set of fabrication process parameters. The examination of the measurement data provides for determining whether an adjustment to the particular set of fabrication process parameters is required to acceptably fabricate the test structure.

Other aspects of the invention will become apparent from the following detailed description, taken in conjunction with the accompanying drawings, illustrating by way of example the principles of the invention.

BRIEF DESCRIPTION OF THE DRAWINGS

FIG. 5 is an illustration showing an exemplary layout DOE that can be applied to the test structures shown in FIGS. 3B and 4B, in accordance with one embodiment of the present invention;

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

It should be appreciated that the present invention can be implemented in numerous ways, including as a process, an apparatus, a system, a device, or a method. Several exemplary embodiments of the invention will now be described in detail with reference to the accompanying drawings.

Modern integrated circuit designs can include complex features that are difficult to fabricate. These complex features may not be appropriately handled by existing optical proximity correction (OPC) and/or reticle enhancement technology (RET). For example, line ends in particular complex layout environments can cause a large exposure of an associated via that is difficult to correct using existing OPC/RET technologies. In one embodiment, a printability simulator and/or custom verification procedures can be used to identify these complex features within a mask layout. Once these complex features are identified, the present invention provides for reducing the complex features to a set of test structures to be included within a test wafer. The set of test structures corresponding to the complex features tend to include complex two-dimensional interactions between geometric features. The present invention further provides for fabrication and testing of the set of test structures to identify adjustments that can improve either the actual mask layout features represented by the test structure or the fabrication processes used to fabricate the actual mask layout features represented by the test structure.

Figure 1:
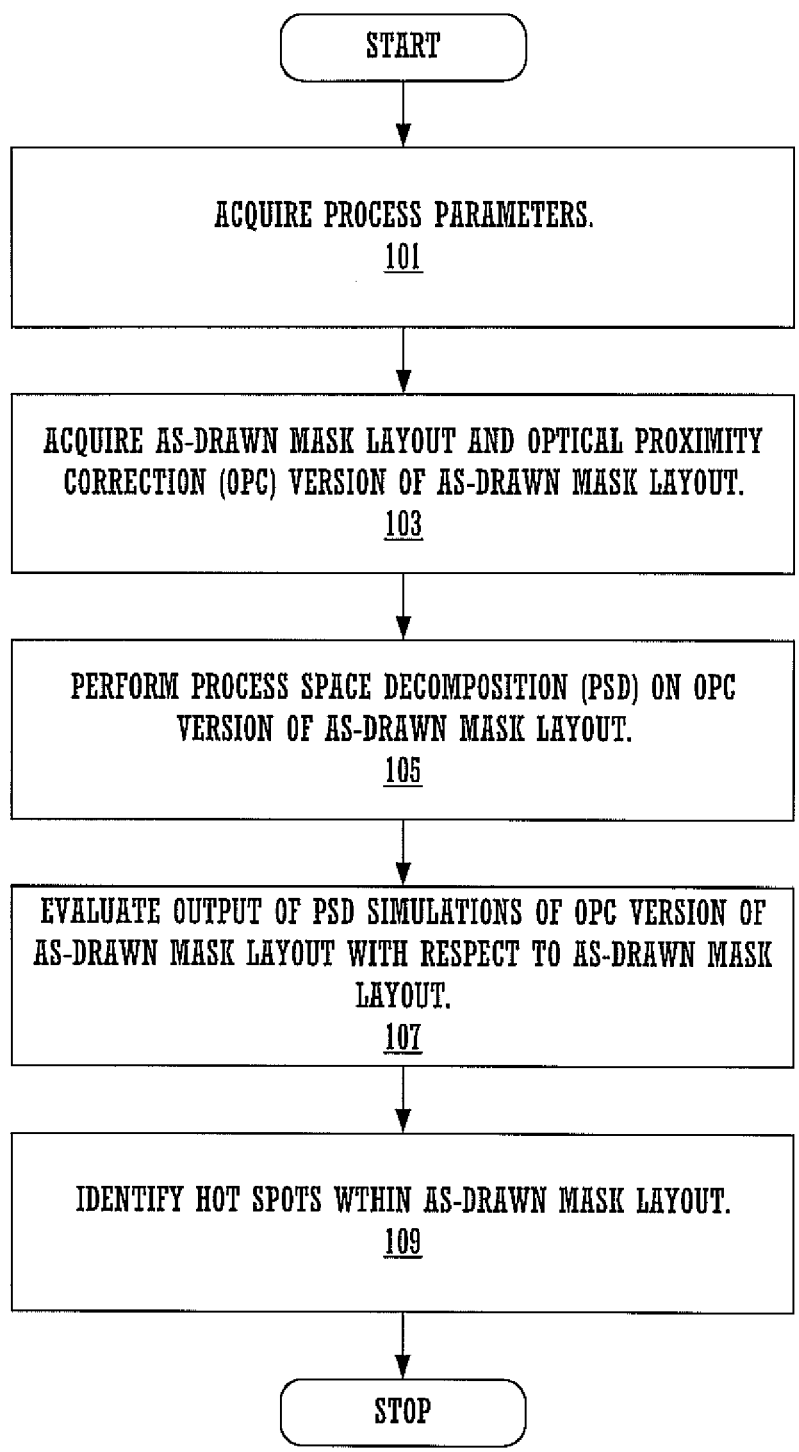
FIG. 1 is an illustration showing an exemplary method for identifying a hot spot within an integrated circuit mask layout, in accordance with one embodiment of the present invention.

In describing embodiments of the present invention, it is beneficial to first describe hot spots that may exist within mask layouts and how the hot spots can be identified. FIG. 1 is an illustration showing an exemplary method for identifying a hot spot within an integrated circuit mask layout, in accordance with one embodiment of the present invention. The hot spot corresponds to a local region of the mask layout having one or more feature geometries susceptible to producing one or more fabrication deficiencies. The fabrication deficiencies may correspond to any type of fabrication deficiency, including but not limited to opens, shorts, unacceptable leakage, unacceptable critical dimension (CD) variations, unacceptable circuit timing characteristics, and unacceptable circuit performance. As used herein without limitation, the hot spot can include a layout artifact that lies on a periphery of a process space. More specifically, the hot spot can include the particular layout artifact and the immediately surrounding region that includes features which may influence the particular layout artifact.

It should be understood that the mask layout can be any type of mask layout defined to be used in fabrication of a circuit or portion thereof within a semiconductor device. For example, the mask layout may correspond to a cell library, a test pattern, or one or more layers within a full chip, among others. In one embodiment, hot spots can be specified using a coordinate on the mask layout and a region surrounding the coordinate, wherein the region is specified to include features that can influence the one or more feature geometries susceptible to producing the fabrication deficiencies. It should be appreciated that the identification of a hot spot does not guarantee that the hot spot will in fact cause fabrication deficiencies. Rather, identification of the hot spot suggests that there are features present within the hot spot that could potentially (or may not) lead to a manifestation of fabrication deficiencies.

A detailed explanation of how hot spots can be identified within a mask layout is provided in PCT Application No. PCT/US2005/005456, which is incorporated herein by reference. It should be understood, however, that the present invention is not limited to use with only the hot spot identification methods disclosed in PCT Application No. PCT/US2005/005456. The present invention can be used with essentially any conceivable method for identifying a hot spot, wherein the hot spot represents a local region of the mask layout having one or more feature geometries susceptible to producing one or more fabrication deficiencies. However, for discussion purposes, the exemplary method for identifying the hot spot within the mask layout, as discussed with respect to FIG. 1, is closely related to the methods described in PCT Application No. PCT/US2005/005456.

The method of FIG. 1 begins with an operation 101 in which process parameters are acquired. The process parameters include any parameters necessary to simulate the photolithography process to be applied to the mask layout. For example, the process parameters can include information such as illumination type (off-axis, monopole, dipole, angular, etc.), wavelength, numerical aperture, etc. It should be appreciated that the above-identified process parameters are examples and do not necessarily represent an inclusive set of process parameters to be acquired.

The method also includes an operation 103 for acquiring the as-drawn mask layout and any OPC/RET version of the as-drawn mask layout. For ease of discussion, the term OPC as used herein corresponds to OPC, RET, a combination of OPC and RET, or any other method, process, or technology that is applied to mask layout features in an attempt to compensate for anticipated variations within the mask layout features that may occur during fabrication. The as-drawn mask layout represents an ideal version of the mask layout feature geometries to be rendered in the photolithography process. The OPC version represents the mask layout that results from application of a particular OPC technology to the as-drawn mask layout. As those skilled in the art will appreciate, OPC technologies attempt to correct for expected photolithographic rendering distortions by adjusting feature geometry shapes and sizes within the mask layout, particularly at locations where rendering of one feature can adversely influence rendering of nearby features.

The method continues with an operation 105 for performing a process space decomposition (PSD) on the OPC version of the as-drawn mask layout. The PSD is a method for analyzing an existing layout for critical layout situations where either limited or no process data is available. The PSD is aimed at decomposing the process impact on a layout feature into a sum of single independent contributions, which reveal the "dimensions" of the process space. Dimensions of the process space considered by the PSD include, but are not limited to, defocus and exposure dependency of a given layout pattern, the CD effects on dense and isolated lines, resist effects, etch effects, and mask error and misalignment effects. The criticality of a given layout pattern is defined by its deviation from the ideal layout pattern based on aerial image, its sensitivity to a particular dimension of the process space, or a combination thereof.

The method further includes an operation 107 for evaluating the output of the PSD simulations of the OPC version of the mask layout with respect to the as-drawn mask layout. The evaluation of operation 107 serves to identify deviations and sensitivities for each layout pattern within the OPC version of the mask layout. Evaluation of the PSD simulation output can also include exploration of the process space by building linear combinations of deviations caused by various parameter effects. These linear combinations can be used to automatically find layout artifacts that lie on a periphery of the process space, i.e., portions of the layout pattern that are most sensitive to some combination of one or more of the process parameters defining the process space.

The method concludes with an operation 109 for identifying hot spots within the as-drawn mask layout. Using the results from operation 107, the layout artifacts that lie on the periphery of the process space can be identified as hot spots. The hot spot includes the particular layout artifact and the immediately surrounding region that includes features which may influence the particular layout artifact. It should be appreciated that the hot spot can be caused by the mask layout itself or by the OPC technology applied to the mask layout.

Once a hot spot is identified, it is prudent to understand how the hot spot behaves with respect to variations in feature geometry, OPC, photolithography, and fabrication. Based on understanding the behavior of the hot spot, one can take informed corrective measures to reduce the probability that the hot spot will cause a fabrication deficiency.

Figure 2:
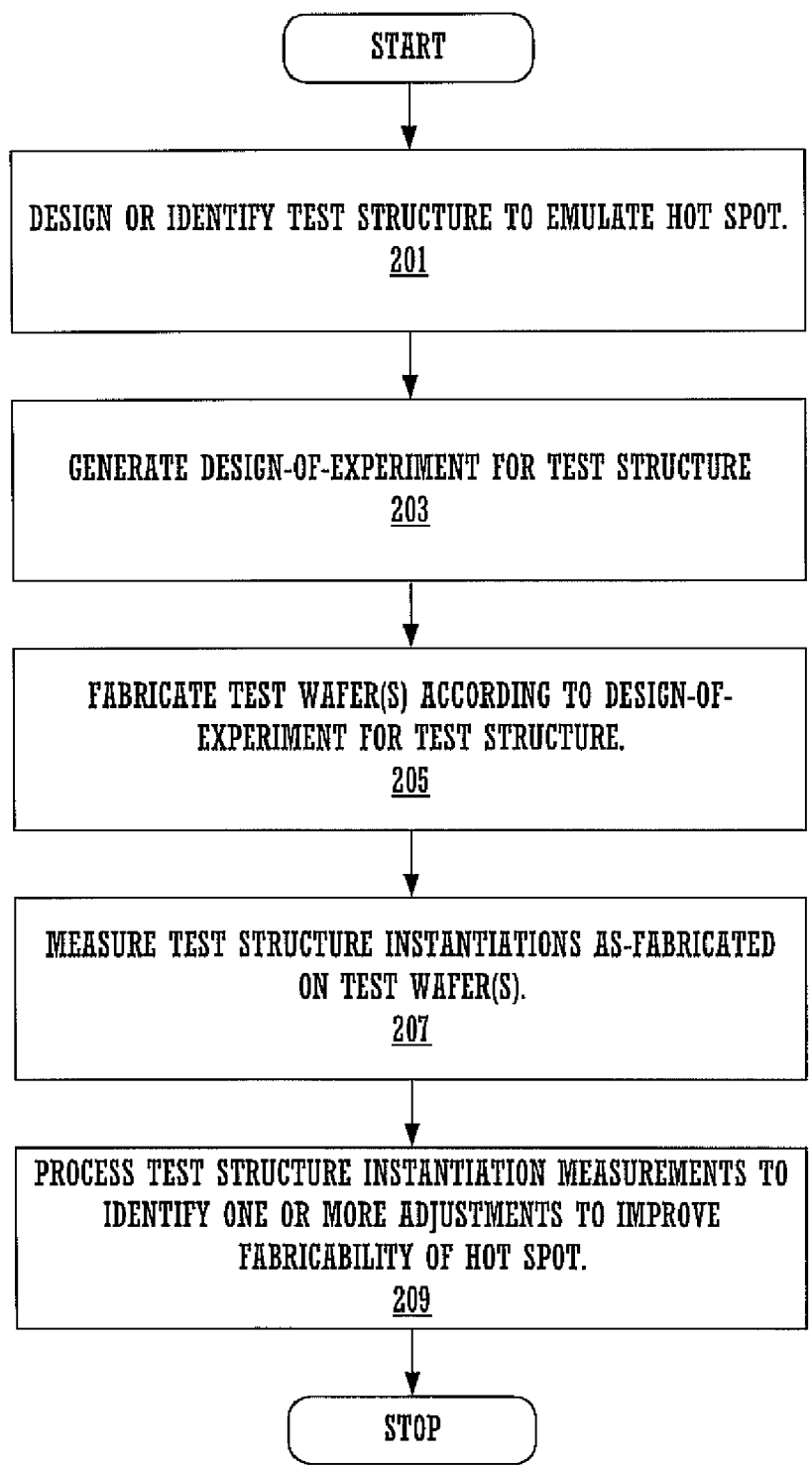
FIG. 2 is an illustration showing a method for investigating the behavior of a hot spot, in accordance with one embodiment of the present invention.

FIG. 2 is an illustration showing a method for investigating the behavior of a hot spot, in accordance with one embodiment of the present invention. The method begins with an operation 201 for designing or identifying a test structure to emulate the hot spot. The test structure is defined to emulate one or more feature geometries within the hot spot that are susceptible to producing one or more fabrication deficiencies. Emulation of the one or more feature geometries of the hot spot often requires the corresponding test structure to be defined in two-dimensions. Definition of the test structure in two-dimensions provides for emulation of surrounding features geometries that can influence a particular problematic feature geometry within the hot spot. Therefore, the test structure for a hot spot is defined to emulate the primary effects within the hot spot that represent potential problems in fabricating the hot spot portion of the mask layout. The complexity of the actual hot spot beyond the types of features that cause the primary effects are not represented in the corresponding test structure. Thus, the test structure for a given hot spot is an abstraction of the hot spot that focuses on the feature geometries and surrounding influences that could cause problems in fabrication. Before continuing with the method of FIG. 2, some example hot spots and corresponding test structures are described with respect to FIGS. 3A-4B.

Figure 3A:
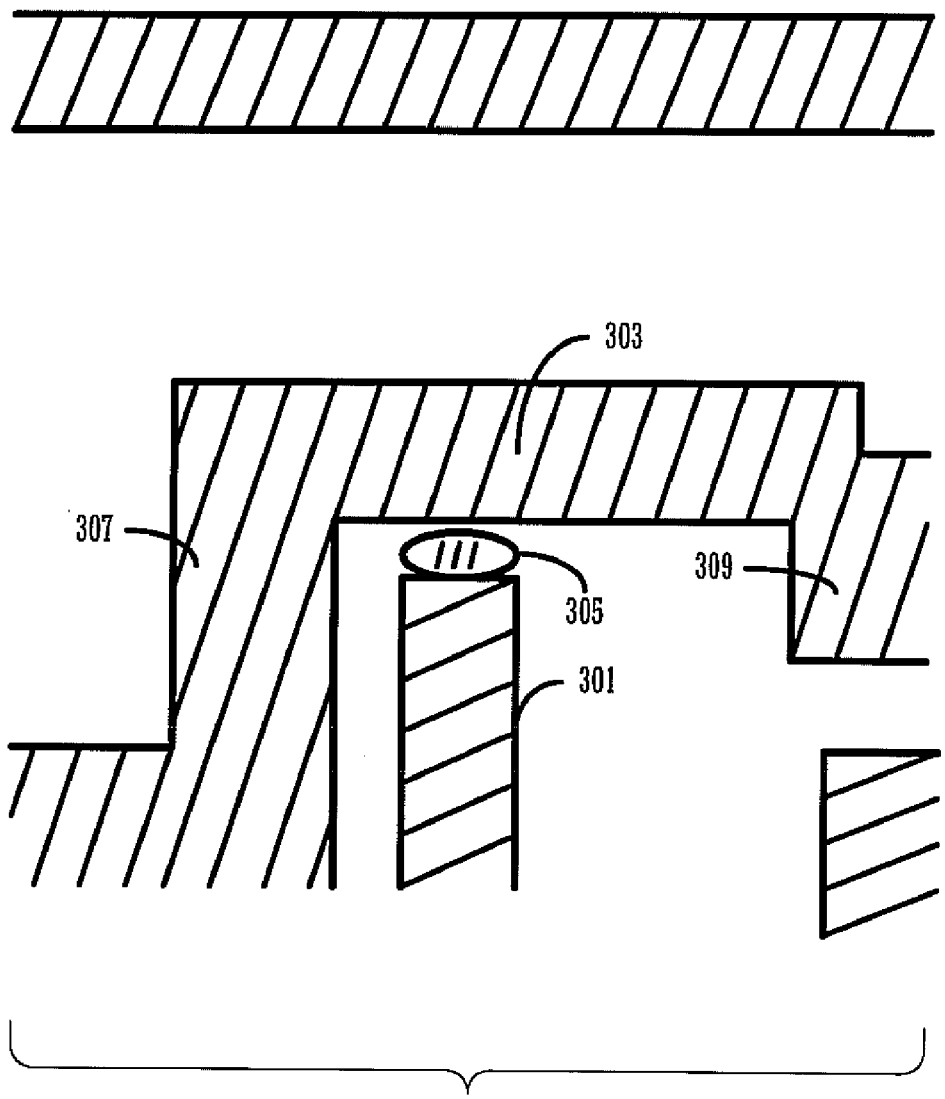
FIG. 3A is an illustration showing an example hot spot within a mask layout, in accordance with one embodiment of the present invention.

FIG. 3A is an illustration showing an example hot spot within a mask layout, in accordance with one embodiment of the present invention. It should be understood that the particular characteristics of the exemplary hot spot of FIG. 3A are provided for discussion purposes only and should not be construed as representing any limitation with respect to what constitutes a hot spot. The hot spot of FIG. 3A includes a feature geometry in which an end of a line 301 perpendicularly approaches another line 303. If the line 301 is fabricated to be longer than specified, a short 305 can occur between lines 301 and 303. The as-fabricated characteristics of lines 301 and 303 can also be influenced by their respective thickness and their proximity to lines 307 and 309.

Figure 3B:
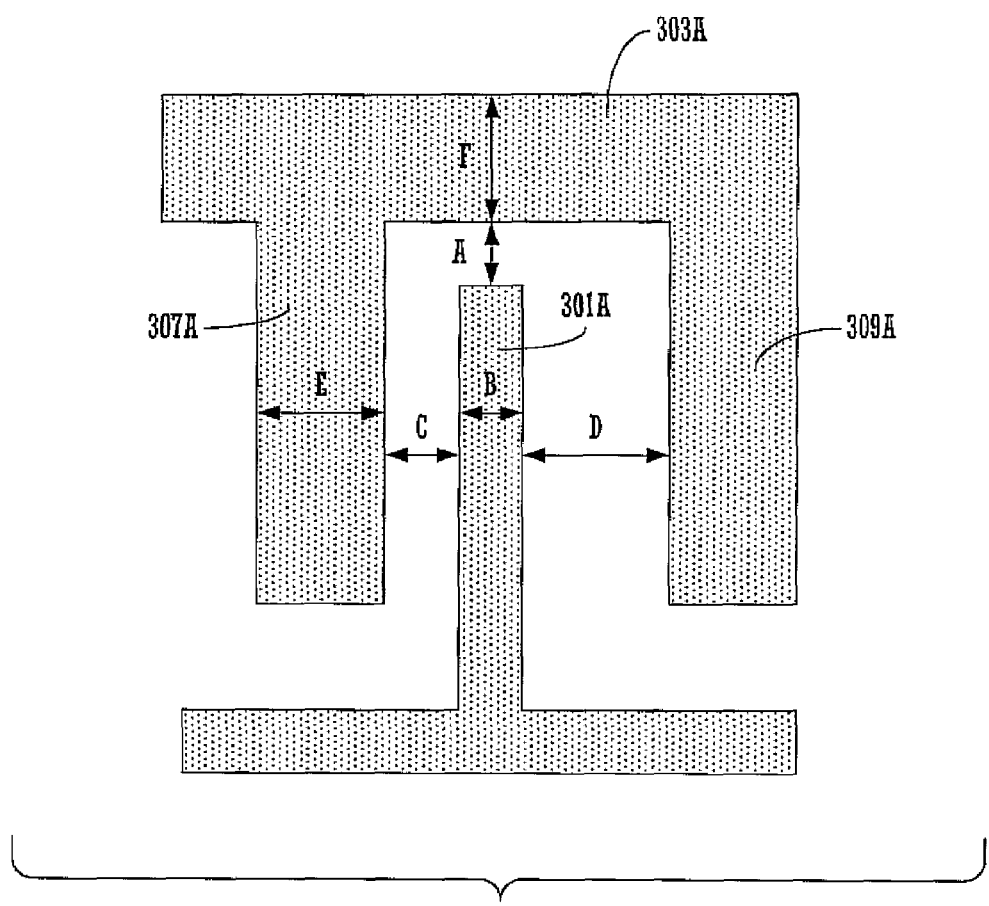
FIG. 3B is an illustration showing a test structure designed to emulate the feature geometries and surrounding influences within the hot spot of FIG. 3A that could cause problems in fabrication, in accordance with one embodiment of the present invention.

FIG. 3B is an illustration showing a test structure designed to emulate the feature geometries and surrounding influences within the hot spot of FIG. 3A that could cause problems in fabrication, in accordance with one embodiment of the present invention. It should be understood that the particular characteristics of the exemplary test structure of FIG. 3B are provided for discussion purposes only and should not be construed as representing any limitation with respect to what constitutes a test structure. The lines 301, 303, 307, and 309 of the hot spot of FIG. 3A are represented by lines 301A, 303A, 307A, and 309A, respectively, within the test structure. It should be appreciated that the test structure emulates the feature geometries that could cause or have an influence on the potential short 305, without including all geometric complexities present within the hot spot. Thus, the test structure is an abstraction of the hot spot that emulates feature geometries of concern.

Figure 4A:
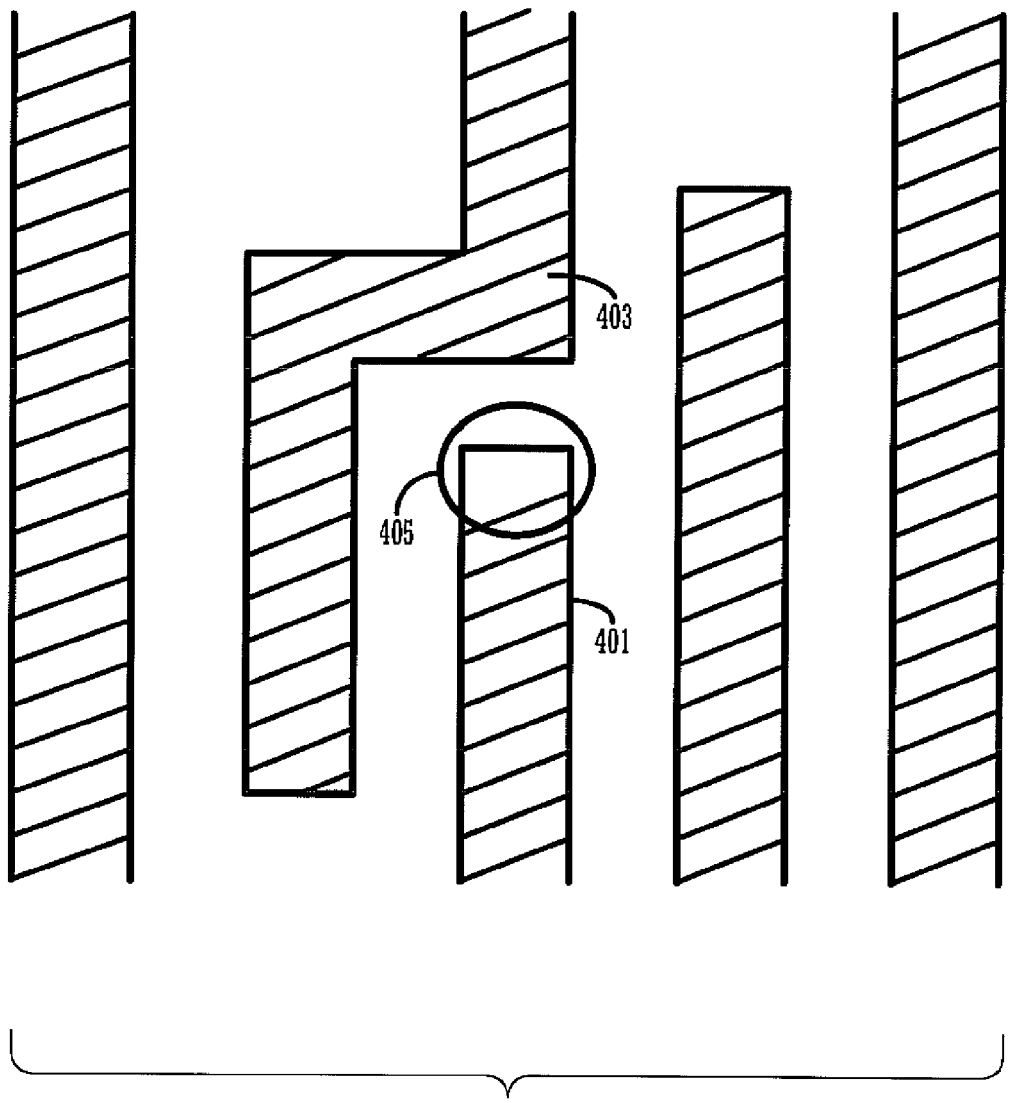
FIG. 4A is an illustration showing another example hot spot within a mask layout, in accordance with one embodiment of the present invention.

FIG. 4A is an illustration showing another example hot spot within a mask layout, in accordance with one embodiment of the present invention. It should be understood that the particular characteristics of the exemplary hot spot of FIG. 4A are provided for discussion purposes only and should not be construed as representing any limitation with respect to what constitutes a hot spot. The hot spot of FIG. 4A includes a feature geometry in which an end of a line 401 perpendicularly approaches another line 403. The line 401 needs to extend beneath a via location 405. If the line 401 is fabricated to be shorter than specified, e.g., due to an OPC adjustment to prevent shorting with line 403, the line 401 may not be connectable to its overlying via.

Figure 4B:
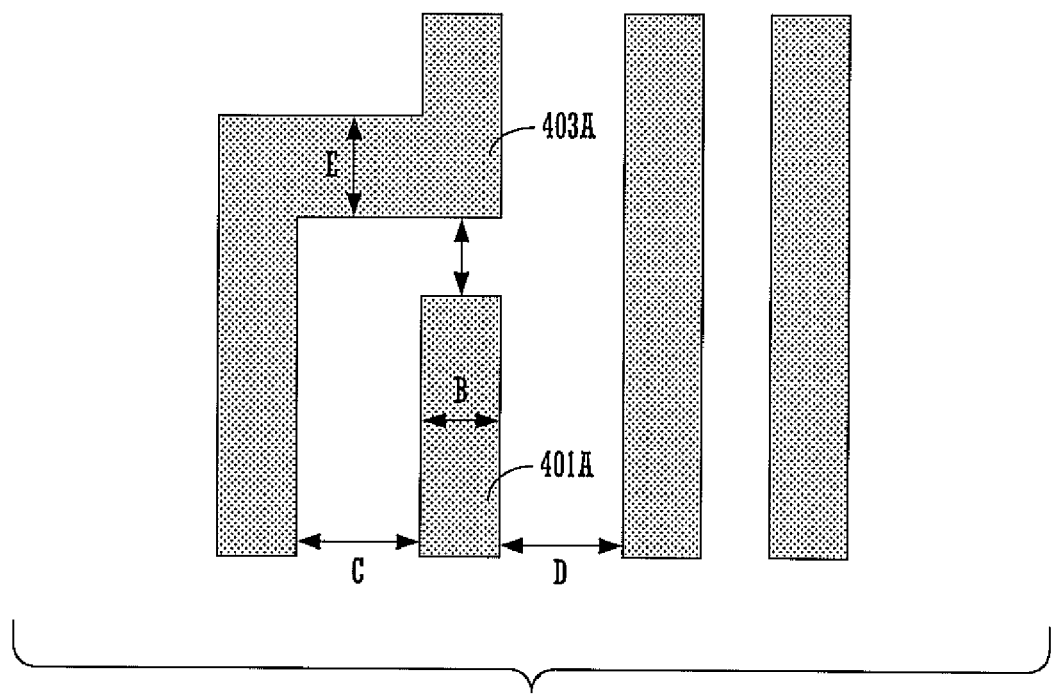
FIG. 4B is an illustration showing a test structure designed to emulate the feature geometries and surrounding influences within the hot spot of FIG. 4A that could cause problems in fabrication, in accordance with one embodiment of the present invention.

FIG. 4B is an illustration showing a test structure designed to emulate the feature geometries and surrounding influences within the hot spot of FIG. 4A that could cause problems in fabrication, in accordance with one embodiment of the present invention. It should be understood that the particular characteristics of the exemplary test structure of FIG. 4B are provided for discussion purposes only and should not be construed as representing any limitation with respect to what constitutes a test structure. The lines 401 and 403 of the hot spot of FIG. 4A are represented by lines 401A and 403A, respectively, within the test structure. The test structure also includes surrounding features that could influence the length of line 401A.

With further regard to the operation 201 within the method of FIG. 2, it should be appreciated that the test structure can be specifically designed for the hot spot of interest or can be identified within a suite of test structures that have been previously designed. More specifically, through evaluation of many mask layouts, a number of common hot spot features may be identified. As test structures are designed for these common hot spot features, the test structures can be compiled into a test structure suite. Then, upon identification of a particular hot spot within a mask layout, the suite of test structures can be queried to determine if an appropriate test structure already exists. The appropriate test structure may have been defined specifically for a previous occurrence of the particular hot spot or may include features sufficiently similar to those of the particular hot spot.

Following the operation 201, the method proceeds with an operation 203 for generating a design-of-experiment (DOE) for the test structure. The DOE is generated to explore the impact of various adjustments in the layout and/or fabrication process of the test structure that can influence fabricability of the feature geometries present within the test structure. It should be appreciated that the DOE can be defined to explore variations of essentially any parameter that can affect the final as-fabricated test structure. Thus, the DOE can include a number of sub-types of DOEs, wherein each sub-type of DOE is defined to explore variations of a particular aspect of test structure layout and fabrication. For example, a layout DOE can be defined to explore how variations in one or more dimensions of one or more geometric features within the test structure affects the as-fabricated test structure. Also, an OPC DOE can be defined to explore how application of one or more OPC technologies to the test structure affects the as-fabricated test structure. A photolithography DOE can be defined to explore how variations in one or more photolithography parameters, e.g., overexposure, underexposure, defocus, mask alignment, mask error, etc., effects the as-fabricated test structure. Additionally, a fabrication DOE can be defined to explore how variations in one or more fabrication processes, e.g., etch, photoresist strip, deposition, etc., affects the as-fabricated test structure.

It should be understood that a DOE can be defined to explore essentially any number of variations of essentially any number of parameters. Also, a DOE can be applied to one or more test structure variations represented in other DOEs. Therefore, it should be appreciated that a DOE can be defined to explore the effects of varying any aspect, or combination of aspects, of test structure layout and fabrication.

FIG. 5 is an illustration showing an exemplary layout DOE that can be applied to the test structures shown in FIGS. 3B and 4B, in accordance with one embodiment of the present invention. It should be understood that the particular characteristics of the exemplary layout DOE of FIG. 5 are provided for discussion purposes only and should not be construed as representing any limitation with respect to what constitutes a layout DOE. As shown in FIGS. 3B and 4B, various geometric features within the test structures are characterized by dimensions A, B, C, D, and E. The layout DOE of FIG. 5 shows a plan by which the dimensions A-E are varied. Each dimension includes a number of variations. For example, dimension A includes up to eight variations (A1, A2, A3, A4, A5, A6, A7, A8). Dimension B includes up to five variations (B1, B2, B3, B4, B5). Dimension C includes up to four variations (C1, C2, C3, C4). Dimension D includes up to two variations (D1, D2). Dimension E includes up to two variations (E1, E2). It should be appreciated that a variation of a dimension can actually be defined to represent the nominal value for the dimension in the test structure. The indication "yes" specifies that the particular combination of dimension variations is to be included within the layout DOE. Each "yes" within the layout DOE represents a different instantiation of the test structure that is to be fabricated and measured. An indication "no" would have indicated that the particular combination of dimension variations is to be excluded from the layout DOE.

Following the operation 203, the method of FIG. 2 continues with an operation 205 for fabricating the test structures represented in the set of DOEs on one or more test wafers. Test structures for layout DOEs and OPC DOEs may be fabricated on the same wafer. However, it may be necessary to fabricate different wafers or different layers within a given wafer to address variations present within photolithography DOEs and fabrication DOEs.

Those skilled in the art will appreciate that fabrication of integrated circuits or portions thereof, e.g., test structures, on a semiconductor wafer involves many different processes. For example, fabrication can include placement of the mask layout of the test structures on a reticle. If an OPC DOE is defined for the test structure, one or more reticles may be created to satisfy the requirements of the OPC DOE. Fabrication can then include deposition of a photoresist material layer on the wafer. Fabrication can then include rendering of the mask layout as defined on the reticle on the photoresist material. If a photolithography DOE is defined, the test structure may be rendered using one or more photolithography methods, wherein each method may include a variation of parameters, e.g., overexposure, underexposure, defocus, mask alignment, etc.

Fabrication can then include development of the photoresist material. Also, fabrication can include etching of exposed regions of the developed photoresist material. If required by a fabrication DOE, the test structures can be subjected to variations in the etch process. This may require the test structure instantiations for a given etch process to be separated onto different test wafer layers or different test wafers. Fabrication can then include stripping of the photoresist material from the wafer. If required by a fabrication DOE, the test structures can be subjected to variations in the photoresist stripping process. Again, this may require the test structure instantiations for a given photoresist stripping process to be separated onto different test wafer layers or different test wafers. Fabrication can then include deposition of a metal within the etched regions and planarization of the wafer.

Following fabrication of the test structures on the test wafer in operation 205, the method continues with an operation 207 for measuring characteristics of the as-fabricated test structure instantiations. The measured characteristics are those characteristics which indicate or provide insight into whether or not a particular test structure instantiation is acceptably fabricated. It should be appreciated that essentially any characteristic can be measured within essentially any test structure. In one embodiment the test structures are defined as electrical test structures that can be measured electrically. The electrical test structures are defined such that electrical leads can be applied to the test structure to enable measurements related to opens, shorts, leakage current, and critical dimension variation, among others. In one embodiment, the critical dimension variation is correlated to measured voltage and resistance characteristics of the test structure. Any test structure, whether it be an electrical test structure or not, can be physically observed, e.g., using a scanning electron microscope (SEM). Physical observations can be used to measure dimensions and CD variation, as well as identify opens and shorts. The measured characteristics of test structure instantiations can be compiled into a database associated with the suite of test structures.

From the operation 207, the method continues with an operation 209 for processing the test structure instantiation measurements associated with the set of DOEs to identify one or more adjustments that can be made to geometric features within the test structure or fabrication processes to improve fabricability of actual mask layout features that are represented by the test structure, e.g., hot spot. The operation 207 can also include processing the test structure instantiation measurements associated with the set of DOEs to identify one or more edges of a process window for actual mask layout features represented by the test structure, e.g., hot spot. The process window defines a domain within which the hot spot is acceptably fabricated, wherein the domain is defined by feature geometries within the hot spot and/or fabrication processes. Based on the test structure measurement processing of operation 209, recommendations can be formulated for adjusting process window parameters that can influence the as-fabricated characteristics of actual mask layout features represented by the test structure. It should be appreciated that the set DOEs for investigating process window parameters, e.g., layout, OPC, photolithography, fabrication, etc., defines how comprehensive recommendations may be for improving fabricability of the mask layout feature represented by the test structure.

Figure 6:
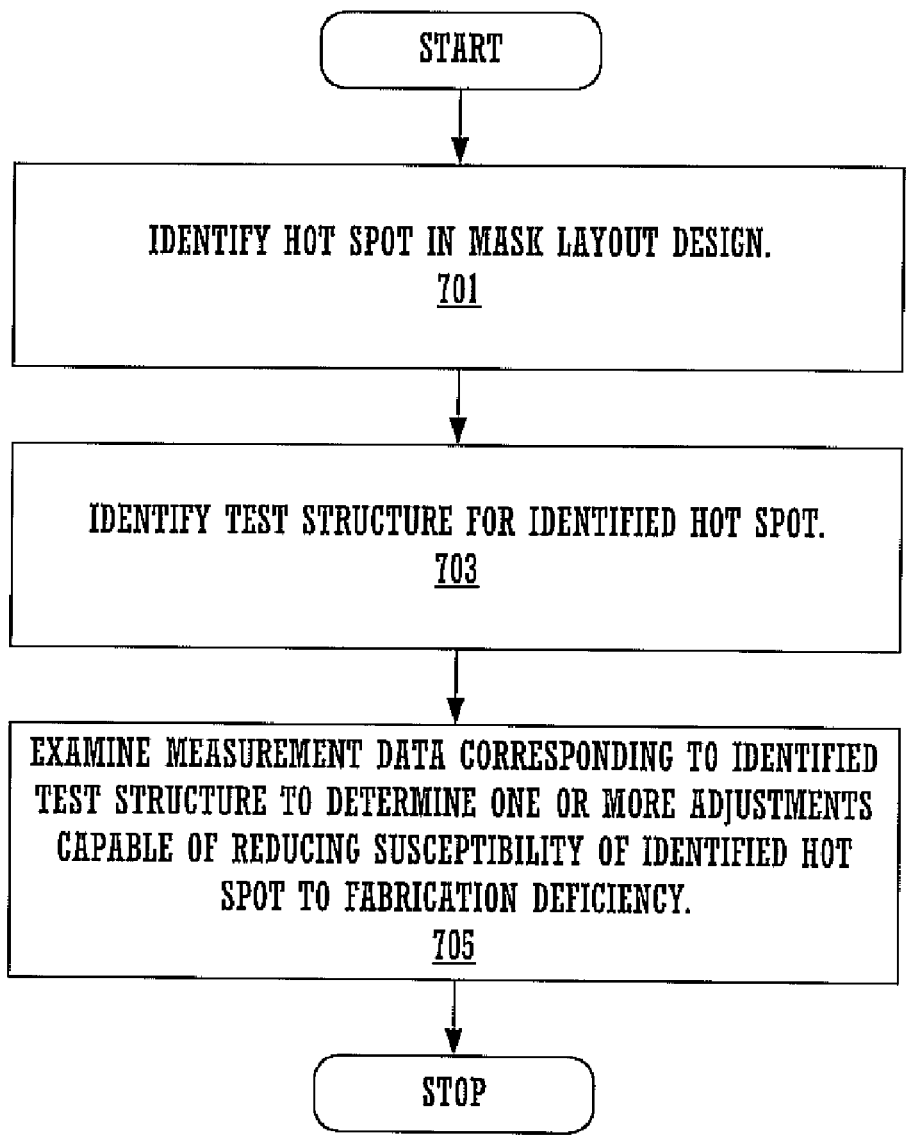
FIG. 6 is an illustration showing a flowchart of a method for examining aspects of a mask layout design, in accordance with one embodiment of the present invention.

With consideration of the foregoing description, several embodiments of the present invention should be appreciated. FIG. 6 is an illustration showing a flowchart of a method for examining aspects of a mask layout design, in accordance with one embodiment of the present invention. It should be understood that the method of FIG. 6 can be implemented within a process flow for producing a semiconductor chip. The method includes an operation 601 for identifying a hot spot in a mask layout design. As previously discussed, the hot spot represents a local region of the mask layout design having one or more feature geometries susceptible to producing one or more fabrication deficiencies. The fabrication deficiencies can include any deficiency that adversely affects the circuitry defined within the hot spot. Some example fabrication deficiencies include opens, shorts, unacceptable critical dimension variations, unacceptable leakage currents, unacceptable timing characteristics, and unacceptable circuit performance.

From the operation 601, the method continues with an operation 603 for generating a test structure for the identified hot spot. As previously discussed, the test structure is defined to emulate the one or more feature geometries within the hot spot that are susceptible to producing the one or more fabrication deficiencies. Also, the test structure can be defined to emulate an environment within a vicinity of the hot spot feature geometries that are susceptible to producing the fabrication deficiencies. In one embodiment, the test structure is defined to be electrically testable.

From the operation 603, the method continues with an operation 605 for fabricating the test structure on a test wafer using specified fabrication processes. In various embodiments, the test structure can be fabricated according to a layout DOE, an OPC DOE, a photolithography DOE, or a fabrication DOE. As previously discussed, the various DOEs include a number of variations of one or more parameters or processes.

The method then continues with an operation 607 for examining the test structure fabricated on the test wafer to identify one or more adjustments to either the geometric features of the hot spot of the mask layout design, the OPC model, the RET techniques, the specified fabrication processes, or any other parameter/process that can affect the as-fabricated characteristics of the hot spot corresponding to the test structure. The identified adjustments can be capable of reducing the potential for fabrication deficiencies. The examining of operation 607 can include performing an electrical measurement and/or a physical measurement on each variation of the test structure to generate measurement data. The measurement data indicates whether each variation of the test structure and fabrication processes when applied to corresponding feature geometries of the hot spot will provide either an acceptable or unacceptable mask layout design of the hot spot. The method can further include an operation for implementing selected adjustments within either the feature geometries of the hot spot, the specified fabrication processes, the applied OPC model, the applied RET techniques, or any other parameter/process that can affect the as-fabricated characteristics of the hot spot. Additionally, the measurement data can be examined in operation 607 to identify one or more edges of the process window for the hot spot.

Figure 7:
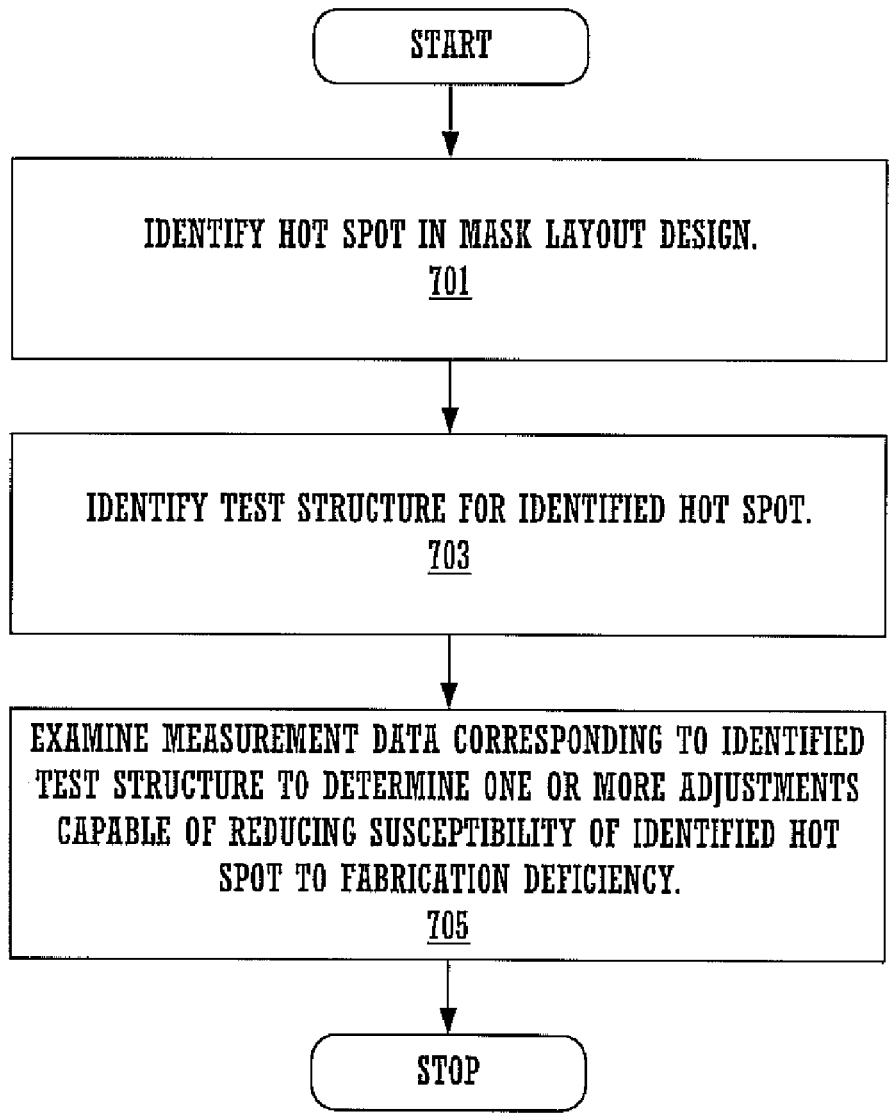
FIG. 7 is an illustration showing a flowchart of another method for examining aspects of a mask layout design, in accordance with one embodiment of the present invention.

FIG. 7 is an illustration showing a flowchart of another method for examining aspects of a mask layout design, in accordance with one embodiment of the present invention. It should be understood that the method of FIG. 7 can be implemented within a process flow for producing a semiconductor chip. The method includes an operation 701 for identifying a hot spot in a mask layout design. As previously discussed, the hot spot represents a local region of the mask layout design having one or more feature geometries susceptible to producing one or more fabrication deficiencies. The method also includes an operation 703 for identifying a test structure that is defined to emulate the feature geometries of the hot spot that are susceptible to producing the fabrication deficiencies. In one embodiment, a suite of test structures is queried to identify the test structure defined to emulate the feature geometries of the hot spot. It should be appreciated that the method of FIG. 7 does not require generation of a test structure specifically for the hot spot.

The method further includes an operation 705 for examining measurement data corresponding to the test structure identified in operation 703. The measurement data is obtained from the identified test structure as fabricated on a test wafer using specified fabrication processes. In one embodiment, the test structure measurement data represents effects due to variation in test structure feature geometry and/or variation in test structure fabrication processes, wherein the test structure fabrication processes include any process or method implemented in taking the test structure from layout to silicon, e.g., OPC, RET, photolithography, etch, strip, etc. Examination of the test structure measurement data enables identification of one or more adjustments to reduce the potential for fabrication deficiencies. The identified adjustments can correspond to a feature geometry adjustment within the hot spot of the mask layout design and/or a fabrication process adjustment, wherein the fabrication process adjustment can be implemented within any process or method used to fabricate the mask layout design on silicon, e.g., OPC, RET, photolithography, etch, strip, etc. The method can further include an operation for examining the test structure measurement data to enable identification of one or more edges of a process window for the hot spot. As previously discussed, the process window defines a domain within which the hot spot is acceptably fabricated, wherein the domain is defined by feature geometries of the hot spot and/or fabrication processes and associated parameters.

Figure 8:
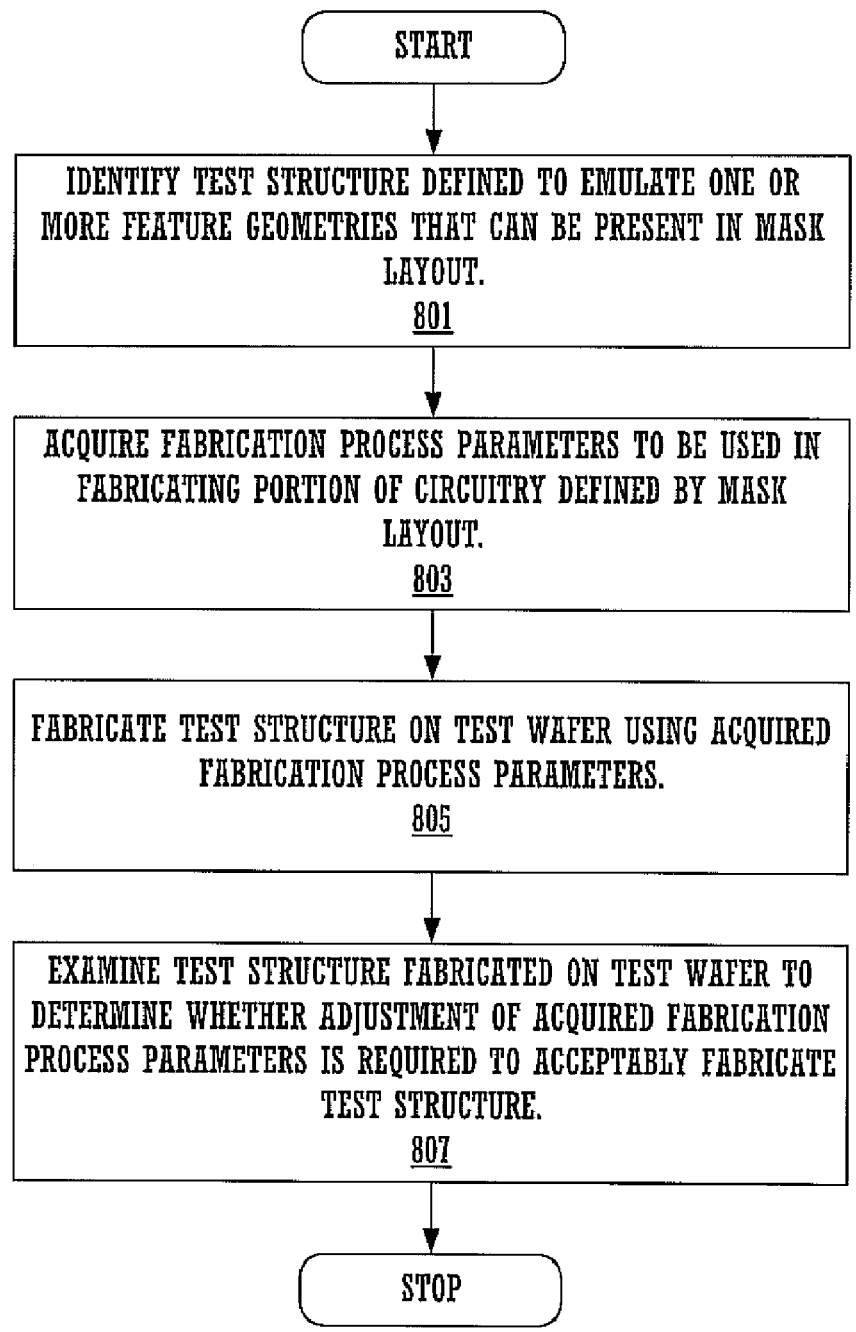
FIG. 8 is an illustration showing a flowchart of a method for improving a semiconductor fabrication process flow, in accordance with one embodiment of the present invention.

FIG. 8 is an illustration showing a flowchart of a method for improving a semiconductor fabrication process flow, in accordance with one embodiment of the present invention. The method includes an operation 801 for identifying a test structure that is defined to emulate one or more feature geometries that can be present within a mask layout. It should be appreciated that the test structure can be identified in operation 801 without having knowledge of a particular association between the identified test structure and an actual mask layout. For example, in one embodiment the test structure is identified within a suite of test structures that has been developed based on examination of a number of actual mask layouts. The method also includes an operation 803 for acquiring fabrication process parameters to be used in fabricating a portion of circuitry represented by the test structure. It should be appreciated that the acquired fabrication process parameters can include parameters associated with any process or method implemented in taking the test structure from layout to silicon, e.g., OPC, RET, photolithography, etch, strip, etc. In an operation 805, the test structure is fabricated on a test wafer using the acquired fabrication process parameters. The method further includes an operation 807 for examining the test structure as fabricated on the test wafer to determine whether an adjustment to the fabrication process parameters is required to acceptably fabricate the test structure.

In one embodiment, the method of FIG. 8 can also include an operation for generating a number of perturbations of the acquired fabrication process parameters. In this embodiment, operation 805 includes fabricating the test structure on one or more test wafers using the number of perturbations of the fabrication process parameters. Also in this embodiment, the operation 807 includes examining the test structure, as fabricated using the number of perturbations of the fabrication process parameters, to determine whether each perturbation of the fabrication process parameters yields an acceptably fabricated test structure. The present embodiment can further include an operation for identifying one or more edges of a process window for fabricating the test structure, wherein the process window defines a domain of fabrication process parameters within which the test structure is acceptably fabricated.

In another embodiment, the method of FIG. 8 can also include an operation for generating a number of perturbations of the test structure, wherein the perturbations are related to feature geometries within the test structure layout. Also in this embodiment, the perturbations of the test structure layout are fabricated on one or more test wafers using the acquired fabrication process parameters. This embodiment then includes examining the number of perturbations of the test structure layout fabricated using the acquired fabrication process parameters to determine whether each perturbation of the test structure layout is acceptably fabricated. The present embodiment can further include an operation for identifying one or more edges of a layout window for the test structure, wherein the layout window defines a domain of test structure layout perturbations within which the test structure is acceptably fabricated using the acquired fabrication process parameters. The present embodiment can further include generating a number of perturbations of the acquired fabrication process parameters and fabricating the perturbations of the test structure layout using the perturbations of the fabrication process parameters. Once fabricated using the perturbations of the fabrication process parameters, an examination can be performed to determine whether each perturbation of the test structure layout is acceptably fabricated using each perturbation of the fabrication process parameters. Then, one or more edges of a process window for acceptably fabricating each perturbation of the test structure layout can be identified.

With the above embodiments in mind, it should be understood that the present invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data which can thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network of coupled computer systems so that the computer readable code is stored and executed in a distributed fashion.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for examining aspects of a mask layout design, comprising:
identifying a hot spot in a mask layout design, wherein the hot spot represents a local region of the mask layout design having one or more feature geometries susceptible to producing one or more fabrication deficiencies;
generating a test structure for the identified hot spot, the test structure defined to emulate the one or more feature geometries susceptible to producing the one or more fabrication deficiencies;
fabricating the test structure on a test wafer using specified fabrication processes; and
examining the test structure fabricated on the test wafer to identify one or more adjustments to either the one or more feature geometries of the hot spot of the mask layout design or the specified fabrication processes, the one or more adjustments capable of reducing the one or more fabrication deficiencies.

2. A method for examining aspects of a mask layout design as recited in claim 1, wherein the method is implemented within a process flow for producing a semiconductor chip.

3. A method for examining aspects of a mask layout design as recited in claim 1, wherein the test structure is further defined to emulate an environment within a vicinity of the feature geometries susceptible to producing one or more fabrication deficiencies within the hot spot.

4. A method for examining aspects of a mask layout design as recited in claim 1, wherein the fabricating includes defining the test structure on a reticle and using the reticle to render the test structure on the test wafer in a photolithography process.

5. A method for examining aspects of a mask layout design as recited in claim 1, wherein the fabrication deficiencies include one or more of an open, a short, an unacceptable critical dimension variation, an unacceptable leakage current, an unacceptable timing characteristic, and an unacceptable circuit performance.

6. A method for examining aspects of a mask layout design as recited in claim 1, wherein the test structure is defined to be electrically testable such that electrical leads can be applied to the test structure to enable one or more of detecting an open, detecting a short, measuring a leakage current, measuring a critical dimension variation, detecting an unacceptable timing characteristic, and detecting an unacceptable circuit performance.

7. A method for examining aspects of a mask layout design as recited in claim 1, wherein the specified fabrication processes include a plurality of variations of one or more particular fabrication processes, the plurality of variations of the one or more particular fabrication processes being used to fabricate respective instantiations of the test structure.

8. A method for examining aspects of a mask layout design as recited in claim 7, wherein the one or more particular fabrication processes include one or more of an optical proximity correction process, a reticle enhancement technology process, a photolithography process, an etching process, and a photoresist stripping process.

9. A method for examining aspects of a mask layout design as recited in claim 1, further comprising:
implementing selected ones of the one or more adjustments within either the one or more feature geometries of the hot spot or the specified fabrication processes.

10. A method for examining aspects of a mask layout design as recited in claim 1, further comprising:
generating a plurality of variations of the test structure, the plurality of variations accounting for potential adjustments to the feature geometries of the hot spot of the mask layout design; and
fabricating the plurality of variations of the test structure on the test wafer using specified fabrication processes.

11. A method for examining aspects of a mask layout design as recited in claim 10, further comprising:
examining the plurality of variations of the test structure fabricated on the test wafer to identify one or more adjustments to either the one or more feature geometries of the hot spot or the specified fabrication processes, the one or more adjustments capable of reducing the one or more fabrication deficiencies.

12. A method for examining aspects of a mask layout design as recited in claim 11, wherein the examining includes performing an electrical measurement, a physical measurement, or both electrical and physical measurements on each variation of the test structure to generate measurement data, the measurement data indicating whether each variation of the test structure when applied to corresponding feature geometries of the hot spot will provide either an acceptable mask layout design of the hot spot or an unacceptable mask layout design of the hot spot.

13. A method for examining aspects of a mask layout design as recited in claim 10, further comprising:
examining the plurality of variations of the test structure fabricated on the test wafer to identify one or more edges of a process window for the hot spot, wherein the process window defines a domain within which the hot spot is acceptably fabricated, the domain defined by either feature geometries of the hot spot, fabrication processes, or both feature geometries of the hot spot and fabrication processes.

14. A method for examining aspects of a mask layout design, comprising:
identifying a hot spot in a mask layout design, wherein the hot spot represents a local region of the mask layout design having one or more feature geometries susceptible to producing one or more fabrication deficiencies;
identifying a test structure that is defined to emulate the one or more feature geometries susceptible to producing the one or more fabrication deficiencies; and
examining measurement data corresponding to the test structure having been fabricated on a test wafer using specified fabrication processes, the examining enabling identification of one or more adjustments to reduce the one or more fabrication deficiencies, the one or more adjustments corresponding to either a feature geometry adjustment within the hot spot of the mask layout design, a fabrication process adjustment, or both a feature geometry adjustment within the hot spot of the mask layout design and a fabrication process adjustment.

15. A method for examining aspects of a mask layout design as recited in claim 14, wherein the method is implemented within a process flow for producing a semiconductor chip.

16. A method for examining aspects of a mask layout design as recited in claim 14, wherein the test structure as fabricated on the test wafer is defined to emulate an environment within a vicinity of the feature geometries susceptible to producing one or more fabrication deficiencies within the hot spot.

17. A method for examining aspects of a mask layout design as recited in claim 14, wherein the measurement data corresponding to the test structure represents effects due to either at least one variation in test structure feature geometry, at least one variation in test structure fabrication processes, or variations in both test structure feature geometry and test structure fabrication processes.

18. A method for examining aspects of a mask layout design as recited in claim 17, wherein the variation in test structure feature geometry includes either a variation in test structure feature dimension, a variation in test structure feature shape, or variations in both test structure feature dimension and test structure feature shape.

19. A method for examining aspects of a mask layout design as recited in claim 17, wherein the variation in test structure fabrication processes includes either a variation in an optical proximity correction (OPC) process, a variation in a reticle enhancement technology (RET) process, a variation in photolithography process, a variation in etching process, a variation in photoresist stripping process, or a combination of variations in one or more of the OPC process, the RET process, the photolithography process, the etching process, and the photoresist stripping process.

20. A method for examining aspects of a mask layout design as recited in claim 14, further comprising:
examining measurement data corresponding to the test structure having been fabricated on a test wafer using specified fabrication processes, the examining enabling identification of one or more edges of a process window for the hot spot, wherein the process window defines a domain within which the hot spot is acceptably fabricated, the domain defined by either features geometries of the hot spot, fabrication processes, or both feature geometries of the hot spot and fabrication processes.

21. A computer readable medium including program instructions for examining aspects of a mask layout design, comprising:

program instructions for identifying a hot spot in a mask layout design, wherein the hot spot represents a local region of the mask layout design having one or more feature geometries susceptible to producing one or more fabrication deficiencies;

program instructions for identifying a test structure that is defined to emulate the one or more feature geometries susceptible to producing the one or more fabrication deficiencies; and program instructions for examining measurement data corresponding to the test structure having been fabricated on a test wafer using specified fabrication processes, the examining enabling identification of one or more adjustments to reduce the one or more fabrication deficiencies, the one or more adjustments corresponding to either a feature geometry adjustment within the hot spot of the mask layout design, a fabrication process adjustment, or both a feature geometry adjustment within the hot spot of the mask layout design and a fabrication process adjustment.

* * * * *